(12) United States Patent
Hwang et al.

(10) Patent No.: US 8,759,841 B2
(45) Date of Patent: Jun. 24, 2014

(54) LIGHT EMITTING DEVICE PACKAGE AND LIGHTING SYSTEM

(75) Inventors: Sung Min Hwang, Seoul (KR); Hyun Don Song, Seoul (KR); Woon Kyung Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/020,157

(22) Filed: Feb. 3, 2011

(65) Prior Publication Data

US 2011/0198644 A1  Aug. 18, 2011

(30) Foreign Application Priority Data

Feb. 18, 2010  (KR) .................. 10-2010-0014770

(51) Int. Cl.
*H01L 27/15* (2006.01)

(52) U.S. Cl.
USPC ............... 257/81; 257/99; 257/79; 257/680

(58) Field of Classification Search
USPC ................ 257/79–103; 438/116, FOR. 153
See application file for complete search history.

(56) References Cited

U.S. PATENT DOCUMENTS

| | | | | |
|---|---|---|---|---|
| 6,155,699 A * | 12/2000 | Miller et al. | ............... | 362/293 |
| 7,682,848 B2 * | 3/2010 | Shimizu et al. | ............... | 438/21 |
| 7,800,287 B2 * | 9/2010 | Zheng et al. | ............... | 313/112 |
| 2007/0246712 A1 | 10/2007 | Kim et al. | | |
| 2008/0149958 A1 * | 6/2008 | Reeh et al. | ............... | 257/98 |
| 2008/0211386 A1 * | 9/2008 | Choi et al. | ............... | 313/503 |
| 2009/0001396 A1 * | 1/2009 | Higaki et al. | ............... | 257/98 |
| 2009/0015138 A1 * | 1/2009 | Daicho et al. | ............... | 313/503 |
| 2009/0053840 A1 * | 2/2009 | Chou et al. | ............... | 438/28 |
| 2009/0101897 A1 * | 4/2009 | Murphy et al. | ............... | 257/48 |
| 2011/0001157 A1 * | 1/2011 | McKenzie et al. | ............... | 257/98 |
| 2011/0089449 A1 * | 4/2011 | Chou et al. | ............... | 257/98 |
| 2012/0032211 A1 * | 2/2012 | Schindler et al. | ............... | 257/98 |

FOREIGN PATENT DOCUMENTS

| | | | |
|---|---|---|---|
| JP | 10-123319 A | 5/1998 | |
| JP | 2001-51114 A | 2/2001 | |
| JP | 2004-177658 A | 6/2004 | |
| JP | 2008-270707 A | 11/2008 | |
| KR | 10-0726970 B1 | 6/2007 | |
| KR | 10-2008-0087218 A | 10/2008 | |
| KR | 10-2009-0000470 A | 1/2009 | |
| TW | 200822400 A | 5/2008 | |
| TW | 200917891 A | 4/2009 | |
| WO | WO 2009039803 A1 * | 4/2009 | ............ H01L 51/52 |

* cited by examiner

*Primary Examiner* — Steven Loke
*Assistant Examiner* — Cuong B Nguyen
(74) *Attorney, Agent, or Firm* — Birch, Stewart, Kolasch & Birch, LLP

(57) ABSTRACT

A light emitting device package includes a sub mount; a light emitting device on the sub mount, and configured to generate light of a first wavelength; a dielectric layer disposed on the sub mount; and a fluorescent layer on the dielectric layer, and configured to convert the light of the first wavelength into light of a second wavelength, wherein the dielectric layer includes a plurality of layers having at least two different refractive indices, that transmits the light of the first wavelength and reflects the light of the second wavelength.

18 Claims, 10 Drawing Sheets

US 8,759,841 B2

LIGHT EMITTING DEVICE PACKAGE AND LIGHTING SYSTEM

CROSS-REFERENCE TO RELATED APPLICATION

This application claims priority under 35 U.S.C. §119 to Korean Patent Application No. 10-2010-0014770 filed in the Korean Intellectual Property Office on Feb. 18, 2010, which is hereby incorporated by reference in its entirety.

BACKGROUND OF THE INVENTION

1. Field of the Invention

Embodiments of the present invention relate to a light emitting device package and a lighting system.

2. Discussion of the Related Art

A light emitting device (LED) includes a p-n junction diode, whose characteristic includes converting electric energy into light energy and which is manufactured by, for example, combining Group III and Group V elements in the periodic table into a compound semiconductor. The LED may be made to display a variety of colors by adjusting the composition ratio of the compound semiconductor.

The LED emits energy that corresponds to an energy gap between a conduction band and a valance band, which occurs after electrons of an n-layer and holes of a p-layer are combined during applying of forward voltage. This energy is typically emitted in a form of heat or light, and is emitted in the form of light in the LED.

For example, since a nitride semiconductor has a high thermal stability and wide band-gap energy, it receives a lot of attentions from optical device and high-output electronic device development fields. Especially, a blue LED, a green LED, and an UV LED, which use a nitride semiconductor, are commercialized and extensively used.

A related art white LED module is realized by combining separate R, G, and B light sources or by combining a blue or ultraviolet light source and a fluorescent material.

In relation to a typical fluorescent material converting method that applies yellow fluorescent material on the edge of a blue LED, light converted from the yellow fluorescent material is emitted, such that it is emitted to all directions. Then, the light re-entering the inside of a light emitting device is absorbed into the device while inside, thereby causing optical loss of the re-entered light, such that light emitting efficiency of the light emitting device is deteriorated.

SUMMARY OF THE INVENTION

Embodiments provide a light emitting device package and a lighting system with effective CRI.

In one embodiment, a light emitting device package includes a sub mount; a light emitting device on the sub mount, and configured to generate light of a first wavelength; a dielectric layer disposed on the sub mount; and a fluorescent layer on the dielectric layer, and configured to convert the light of the first wavelength into light of a second wavelength, wherein the dielectric layer includes a plurality of layers having at least two different refractive indices, that transmits the light of the first wavelength and reflects the light of the second wavelength.

In another embodiment, a light emitting device package includes a sub mount; a light emitting device on the sub mount, and configured to generate light of a first wavelength; a filter disposed on the sub mount; a capping layer on the filter; and a fluorescent layer on the capping layer, and configured to convert the light of the first wavelength into light of a second wavelength, wherein the filter includes a plurality of layers having at least two different refractive indices, that transmits the light of the first wavelength and reflects the light of the second wavelength.

The details of one or more embodiments are set forth in the accompanying drawings and the description below. Other features will be apparent from the description and drawings, and from the claims.

DETAILED DESCRIPTION OF THE EMBODIMENTS

Hereinafter, a light emitting package and a lighting system will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
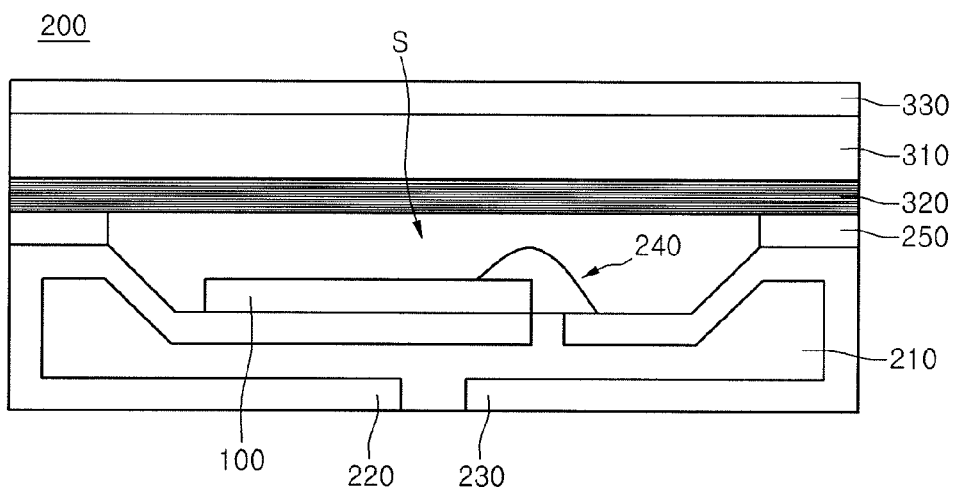
FIG. 1 is a sectional view of a light emitting device package 200 according to an embodiment.

FIG. 1 is a sectional view of a light emitting device package 200 according to an embodiment.

The light emitting device package 200 includes a sub mount 210, a light emitting device chip 100 on the sub mount 210, a wavelength filter 320 on the sub mount 210, a space S between the light emitting device chip 100 and the wavelength filter 320, and a fluorescent layer 330 on the wavelength filter 320.

The fluorescent layer 330 may have a uniform thickness but is not limited thereto. According to an embodiment, since the wavelength filter 320 has a uniform top surface, forming of a conformal coating fluorescent layer may be accomplished without difficulties.

Figure 13:
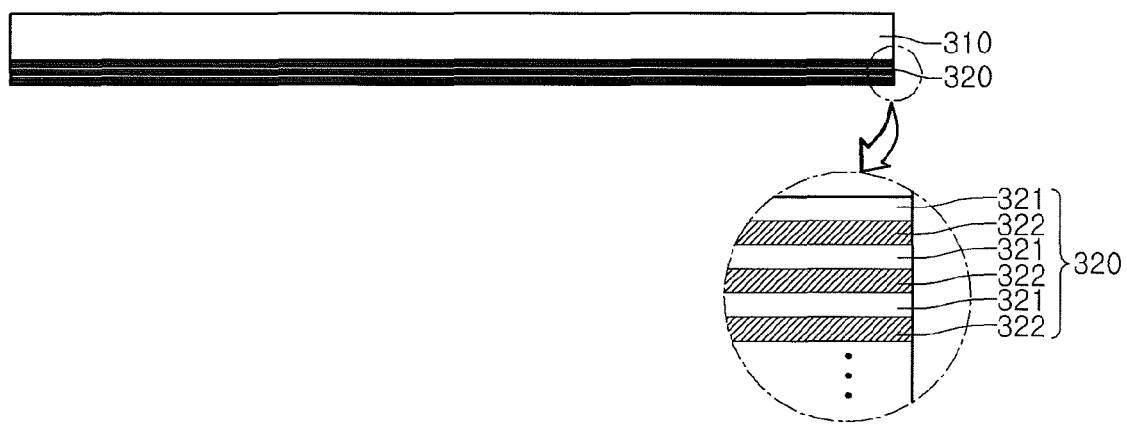

The wavelength filter 320 may include a plurality of dielectric layers having respectively different refractive indices. For example, as shown in FIG. 13, the wavelength filter 320 may include a first dielectric layer 321 having a first refractive index and a second dielectric layer 322 having a second refractive index different from the first refractive index.

In this instance, the thickness of the first dielectric layer 321 and the second dielectric layer 322 may be $\lambda/(4n\times\cos\theta)$ (where $\lambda$ is a wavelength of light, $n$ is a refractive index of each dielectric layer, and $\theta$ is an incidence angle of light)

FIGS. 2 through 5 are graphs illustrating optical characteristics of a light emitting device package according to an embodiment. FIG. 6 is a view when a light emitting device package emits light according to an embodiment.

Figure 2:
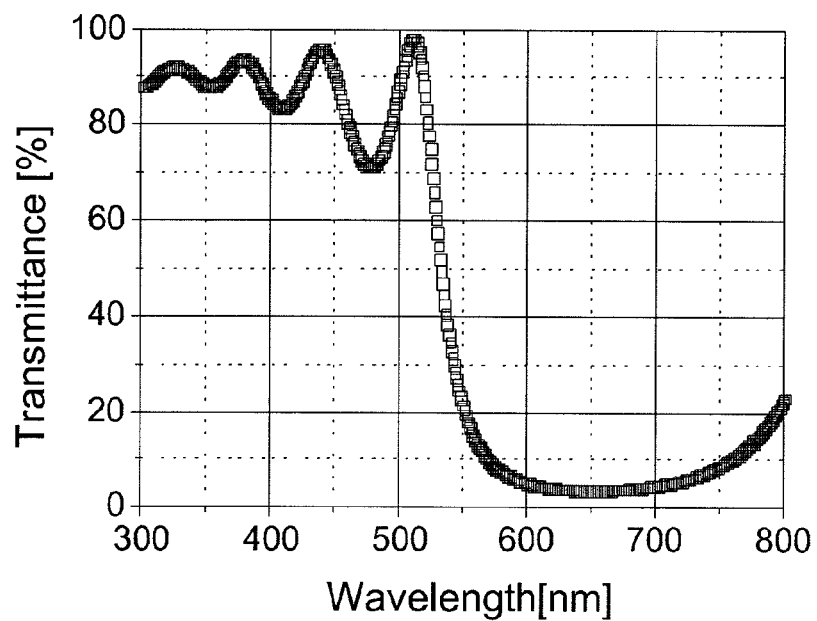
FIGS. 2 through 5 are graphs illustrating optical characteristics of a light emitting device package according to an embodiment.
Figure 3:
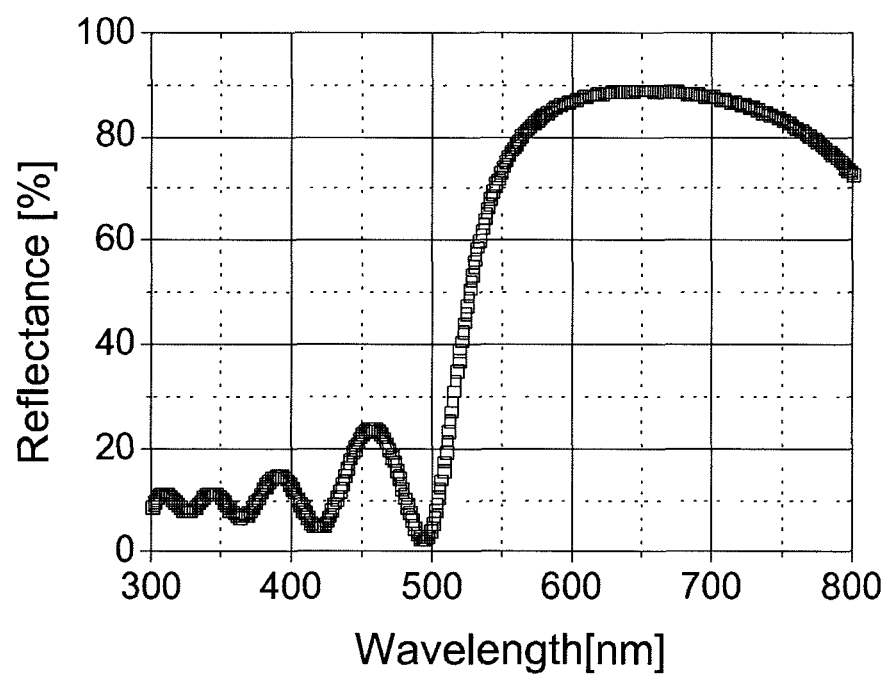

In more detail, FIG. 2 shows transmittance according to a wavelength of light from the inside to the outside of the light emitting package. FIG. 3 shows reflectivity according to wavelength of light from the outside to the inside of the light emitting device package.

A wavelength filter 320 (also referred to as a selective wavelength filter), disposed between the light emitting device chip 100 and the fluorescent layer 330, may be one that is selective of one or more wavelengths of light, and is formed with a stacked layered structure of a material of a low refractive index and a material of a high refractive index, such that light of a short wavelength from the inside of the light emitting device package passes through easily to the outside of the light emitting device package, as referenced in FIG. 2, but light of a long wavelength converted from the fluorescent layer 330 is re-reflected, such that a characteristic preventing or reducing the light from entering into the light emitting device package is shown, as referenced in FIG. 3.

Moreover, in the light emitting device package, there is the space S between the selective wavelength filter 320 and the light emitting device chip 100, and the space S may be one having at least one of air, Ar gas, $N_2$ gas, and vacuum. Accordingly, as shown in FIG. 6, the light L1 of short wavelength emitted from the light emitting device chip 100 is easily extracted to the outside through the wavelength filter 320, but the light L2 of long wavelength converted from the light L1 of the short wavelength emitted from the light emitting device chip 100 by the fluorescent material of the fluorescent layer 330 is reflected by the wavelength filter 320 so that the light L2 of the long wavelength are all (or mostly) extracted to the outside. Thus, the wavelength filter 320 may effectively increase reflectivity using inner total reflection effect from a high refractive index to a low refractive index. The light L1 of short wavelength may be blue light, which has a wavelength of about 440 nm to 460 nm. The light L2 of long wavelength may be yellow light, which has a wavelength of about 560 to 580 nm.

Figure 4:
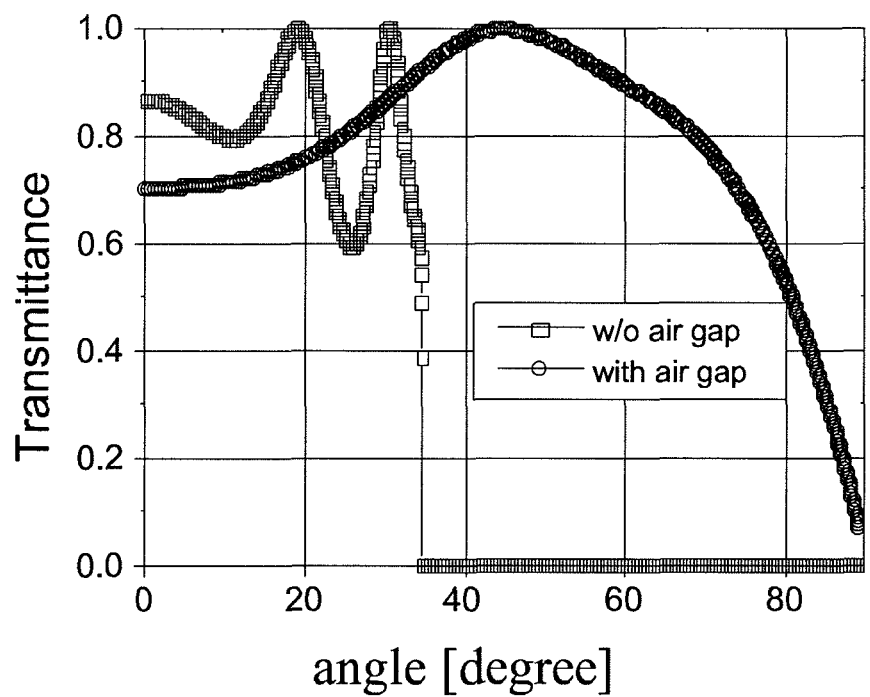

For example, FIG. 4 is a graph illustrating transmittance of short wavelength light generated in the light emitting device according to whether or not an air gap is used in the light emitting device package according to an embodiment. As shown in FIG. 4, when an air gap is used, transmittance is generally high at an incidence angle of greater than 30° and less than about 75°. When an air gap is not used, the transmittance is generally high (or fluctuating) until at an incidence angle of greater than 30° (where the transmittance becomes zero so as to have all reflection).

Figure 5:
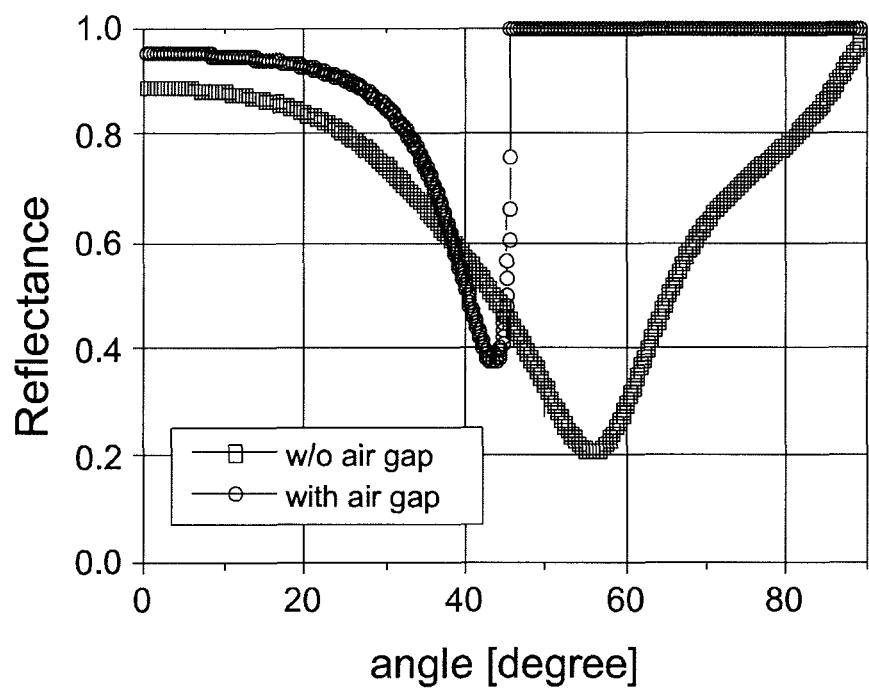
Figure 6:
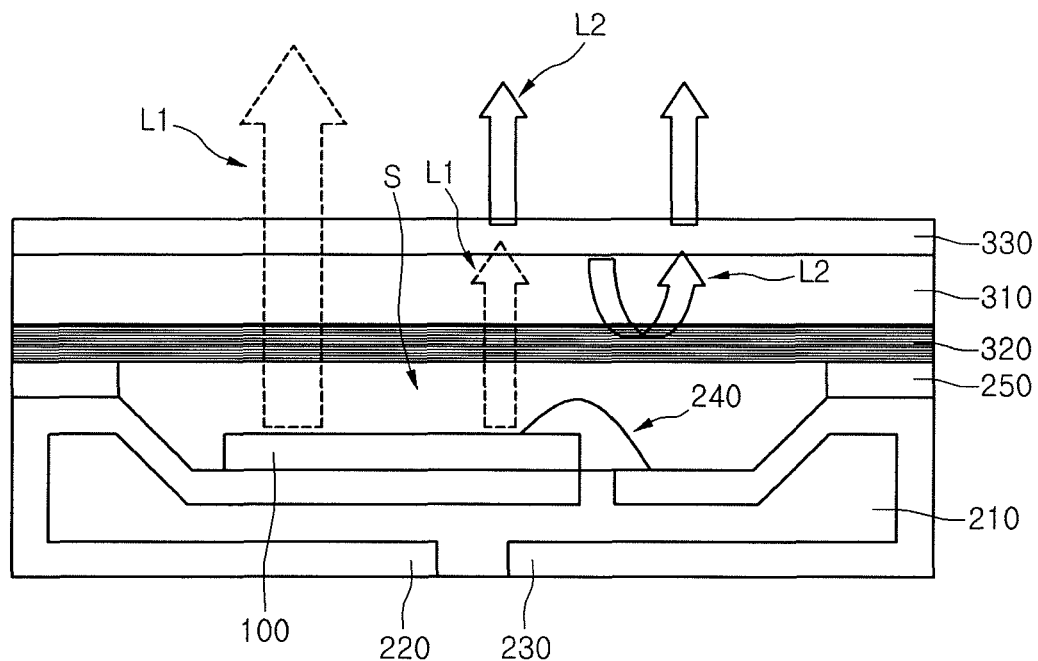
FIG. 6 is a view when a light emitting device package emits light according to an embodiment.

FIG. 5 is a graph illustrating reflectivity of long wavelength light generated from a fluorescent material disposed outside the light emitting device according to whether or not an air gap is used in a light emitting device package. When an air gap is used, reflectivity of a long wavelength is generally high except for around an incidence angle of slightly more than 40°. When an air gap is not used, reflectivity of a long wavelength has a v-shape with a low point around an incidence angle of slightly less than 60°.

The light emitting device package according to an embodiment, a selective wavelength filter between the light emitting chip and the fluorescent layer transmit light of a short wavelength having a high energy like a blue visible ray or an ultraviolet ray but reflects light of a long wavelength having a low energy from a fluorescent material, such that effective color rendering index can be obtained.

Hereinafter, referring to FIGS. 7 through 16, processes in a method of manufacturing a light emitting device package will be described according to an embodiment.

Figure 7:
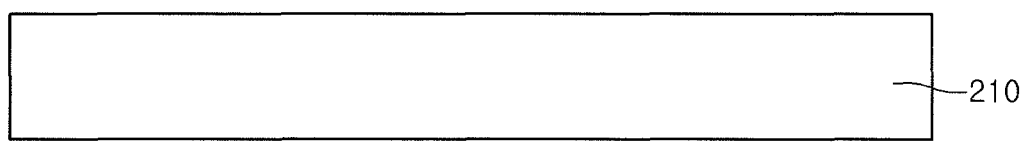
FIGS. 7 through 16 are views illustrating processes in a method of manufacturing a light emitting device according to an embodiment.

First, a sub mount 210 is prepared as shown in FIG. 7. The sub mount 210 may be formed of a material having a similar thermal expansion coefficient to a light emitting device chip material and excellent thermal conductivity. For example, the sub mount 210 may be formed with silicon material, synthetic resin material, or metal material. For example, the sub mount 210 may be formed of silicon (Si) but is not limited thereto. PCB or low temperature co-fired ceramic (LTCC) may be used for the sub mount 210.

Figure 8:
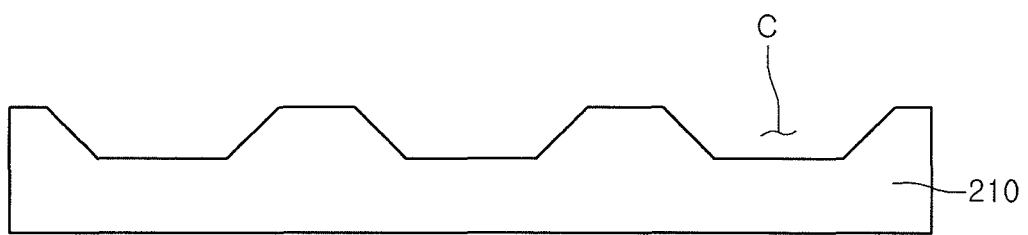

Next, as shown in FIG. 8, a cavity C may be formed by partially removing a portion of the sub mount 210. An isolation process may be performed on the sub mount 210 with the cavity C.

Figure 9:
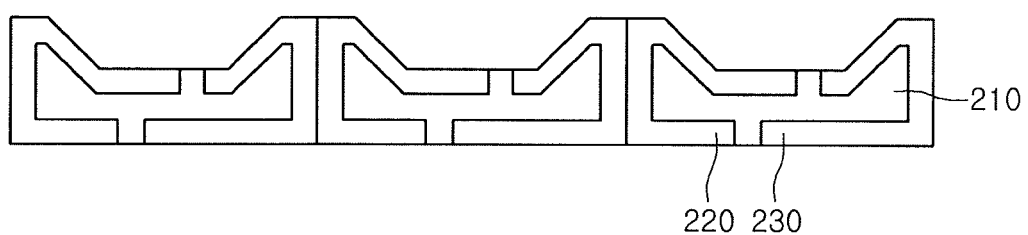

Next, as shown in FIG. 9, a first electrode layer 220 and a second electrode layer 230 may be formed on the sub mount 210. The first electrode layer 220 and the second electrode layer 230 may be electrically separated from each other and serve as conduits to provide power to the light emitting device chip 100. Moreover, the first electrode layer 220 and the second electrode layer 230 may serve to increase light efficiency by reflecting light generated from the light emitting device chip 100 and may serve to discharge heat generated from the light emitting device chip 100 to the outside.

The sub mount 210 may include a separate reflector cup and a device for preventing ESD (electrostatic discharge) of a Zenor diode which may be formed in the sub mount 210.

Figure 10:
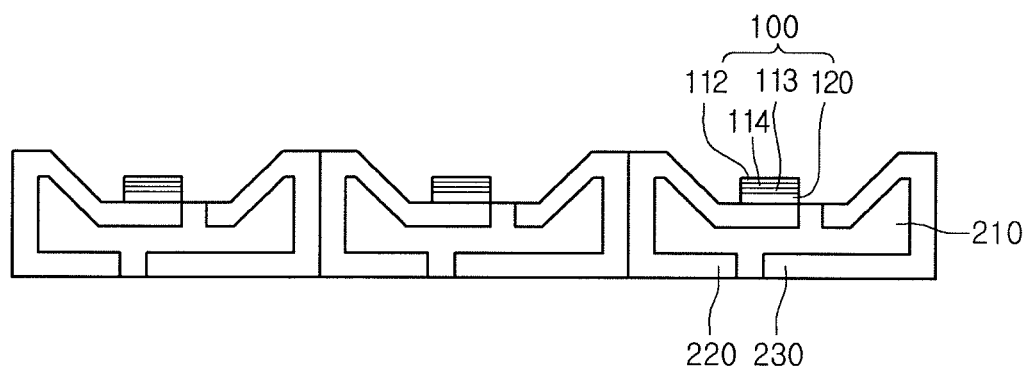

Next, as shown in FIG. 10, the light emitting device chip 100 is mounted on the sub mount 210. The light emitting diode chip 100 may be first manufactured to be mounted on the sub mount 210.

The light emitting device chip 100 may be formed of GaN, GaAs, GaAsP, and GaP. For example, green to blue LEDs may use GaN (or InGaN) and Yellow to Red LEDs may use InGaAlP and AlGaAs. In addition, full color may be realized according to a composition change of material for the compound semiconductor of the light emitting diode chip 100.

Hereinafter, a manufacturing process of the light emitting device chip 100 may be described, but the manufacturing process is not limited thereto.

First, a first substrate is prepared. The first substrate includes a conductive substrate or an insulation substrate. For example, the first substrate may use at least one of $Al_2O_3$, SiC, Si, GaAs, GaN, ZnO, Si, GaP, InP, Ge, and $Ga_2O_3$. Foreign materials of impurities on the surface may be removed by wet-cleansing the first substrate.

Later, a light emitting structure including the first conductive type semiconductor layer 112, the active layer 114, and the second conductive type semiconductor layer 113 may be formed on the first substrate.

The first conductive type semiconductor layer 112 may be realized with group III-V compound semiconductors where a first conductive type dopant is doped. If the first conductive type semiconductor layer 112 is an N-type semiconductor layer, the first conductive type dopant is an N-type dopant and thus may include Si, Ge, Sn, Se, and Te but is not limited thereto.

The first conductive type semiconductor layer 112 may include a semiconductor material having a composition equation of $In_xAl_yGa_{1-x-y}N$ ($0 \leq x \leq 1$, $0 \leq y \leq 1$, $0 x+y \leq 1$).

The first conductive type semiconductor layer 112 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive type semiconductor layer 112 may be formed as an N-type GaN layer using methods such as Chemical Vapor Deposition (CVD), Molecular Beam Epitaxy (MBE), sputtering, and Hydride Vapor Phase Epitaxy (HVPE). Moreover, the first conductive type semiconductor layer 112 may be formed by injecting TMGa, $NH_3$, $N_2$, and $SiH_4$ including an n-type impurity such as Si in a chamber.

The active layer 114 may be formed with at least one of a single quantum well structure, a multi quantum well (MQW) structure, a quantum wire structure, or a quantum dot structure. For example, the active layer 114 may be formed with a MQW structure into which TMGa, $NH_3$, $N_2$, and TMIn are implanted, but is not limited thereto.

A well layer/barrier layer of the active layer 114 may be formed with a pair structure of at least one of InGaN/GaN, InGaN/InGaN, AlGaN/GaN, InAlGaN/GaN, GaAs/AlGaAs (or InGaAs), and GaP/AlGaP (or InGaP) but is not limited thereto. The well layer may be formed of a material having a lower band gap than the barrier layer.

A conductive type clad layer may be formed at least one of on and below the active layer 114. The conductive type clad layer may be formed of AlGaN based semiconductor, and may have a higher band gap than the active layer 114.

The second conductive type semiconductor layer 113 may have a group III-V compound semiconductor to which a second conductive type dopant is doped, such as a semiconductor material having a composition equation of $In_xAl_yGa_{1-x-y}N$ ($0 \leq x \leq 1$, $0 \leq y \leq 1$, $0 \leq x+y \leq 1$). The second conductive type semiconductor layer 113 may be selected from GaN, AlN, AlGaN, InGaN, InN, InAlGaN, AlInN, AlGaAs, GaP, GaAs, GaAsP, and AlGaInP. If the second conductive type semiconductor layer 116 is a P-type semiconductor layer, the second conductive type dopant may include Mg, Zn, Ca, Sr, and Ba as a P-type dopant. The second conductive type semiconductor layer 116 may be formed with single or multi-layers, but is not limited thereto.

The second conductive type semiconductor layer 116 is formed of a p-type GaN layer into which $(EtCp_2Mg)\{Mg(C_2H_5C_5H_4)_2\}$ including a p-type impurity such as TMGa, $NH_3$, $N_2$, or Mg is implanted but is not limited thereto.

In this embodiment, the first conductive type semiconductor layer 112 may be realized with an N-type semiconductor layer and the second conductive type semiconductor layer 116 may be formed of a P-type semiconductor layer, but they are not limited thereto. Furthermore, a semiconductor having an opposite polarity to the second conductive type such as an N-type semiconductor layer may be formed on the second conductive type semiconductor layer 116. Accordingly, the light emitting structure 110 may be realized with one of an N-P junction structure, a P-N junction structure, an N-P-N junction structure, and a P-N-P junction structure.

Next, a second electrode layer 120 is formed on the second conductive semiconductor layer 116. The second electrode layer 120 may include an ohmic layer, a reflective layer, a contact layer, and a support substrate.

For example, the second electrode layer 120 may include an ohmic layer and the ohmic layer may make ohmic contact with the light emitting structure 110 to allow power to be smoothly supplied. The ohmic layer may be formed by stacking a single metal or a metal alloy and a metal oxide in a multi-layered form.

For example, the ohmic layer may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, and Hf and is not limited thereto.

Moreover, the second electrode layer 120 may include a reflective layer and therefore reflect light incident from the light emitting structure 110 such that light extraction efficiency can be improved.

For example, the reflective layer may be formed of a metal or an alloy, which includes at least one of Ag, Ni, Al, Rh, Pd, Ir, Ru, Mg, Zn, Pt, Au, and Hf. Furthermore, the reflective layer may be formed of the metal or the alloy and transparent conductive material such as IZO, IZTO, IAZO, IGZO, IGTO, AZO, and ATO in a multi layer form, and may be formed by stacking IZO/Ni, AZO/Ag, IZO/Ag/Ni, and AZO/Ag/Ni.

In addition, if the second electrode layer 120 includes a junction layer, the reflective layer may serve as a junction layer, or may include a barrier metal or a bonding metal. For example, the junction layer may include at least one of Ti, Au, Sn, Ni, Cr, Ga, In, Bi, Cu, Ag or Ta.

In addition, the second electrode layer 120 may include a support substrate. The support substrate supports the light emitting structure 110 and may be a conduit to provide power to the light emitting structure 110. The support substrate may be formed of a metal, a metal alloy, or a conductive semiconductor material of excellent electrical conductivity.

For example, the support substrate may include one of Cu, Cu alloy, Au, Ni, Mo, Cu—W, and a carrier wafer such as Si, Ge, GaAs, GaN, ZnO, SiGe, and SiC.

A method of forming the support substrate may include an electro-chemical metal deposition method, a plating method, and a bonding method using a eutectic metal.

Next, the first substrate is removed to expose the first conductive type semiconductor layer 112. A method of removing the first substrate may include a laser lift off method or a chemical lift off method. Additionally, the first substrate may be removed with physical grinding.

Next, the light emitting device chip 100 is attached on the sub mount 210. Attaching the light emitting device chip 100 on the sub mount 210 may be performed through a method including attaching the light emitting device chip 100 with a polymer adhesive or using a eutectic metal plated on the light emitting device chip 100.

For example, a light emitting device chip 100 is attached through soldering by using Ag conductive epoxy with excellent process ability or if high thermal conductivity is required, a eutectic junction method may be adopted but is not limited thereto.

The light emitting device chip 100 may be electrically connected to the first electrode layer 220 and the second electrode layer 230.

Figure 11:
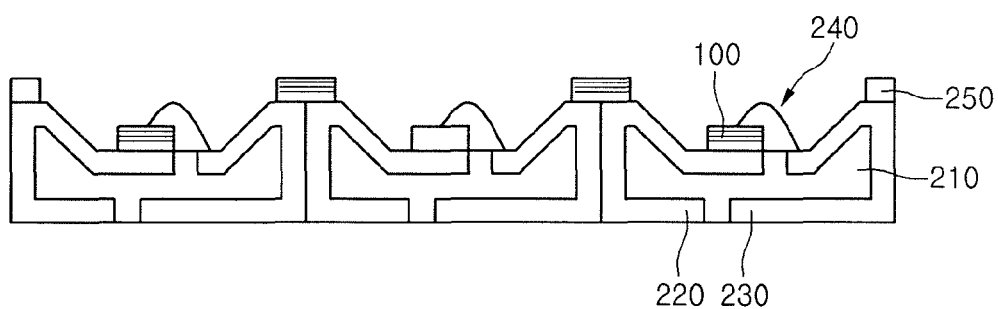

Next, as shown in FIG. 11, the light emitting device chip 100 may be electrically connected to the first electrode layer 220 and/or the second electrode layer 230 through a wire 240. In this instance, the light emitting device chip 100 may be a vertical type light emitting device chip, and thus one wire 240 is used. In another example, the light emitting device chip 100 may be a parallel type light emitting device chip, and thus two wires 240 may be used.

Next, a sealing material 250 may be formed on the sub mount 210. The sealing material 250 includes glass, eutectic material and epoxy material, but is not limited thereto.

Figure 14:
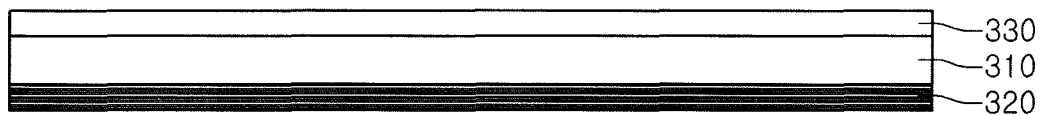

Next, referring to FIGS. 12 through 14, a wavelength filter 320 including a fluorescent layer 330 will be described.

Figure 12:
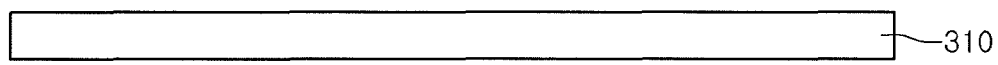

First, as shown in FIG. 12, a capping layer 310 is prepared. The capping layer 310 may be formed of glass but is not limited thereto. Next, as shown in FIG. 13, a wavelength filter 320 is formed on the capping layer 310.

The wavelength filter 320 may include layers where dielectric layers having respectively different refractive indices are repeatedly stacked.

For example, the wavelength filter 320 may include a first dielectric layer 321 having a first refractive index and a second dielectric layer 322 having a second refractive index different from the first refractive index of the first dielectric layer 321.

A stacked layered structure of the first dielectric layer 321 and the second dielectric layer 322 may be formed with a plurality of periods. For example, a $SiO_2$ layer (which is used as the first dielectric layer 321) having a refractive index of 1.46 with respect to a 450 nm blue wavelength and a $TiO_2$ layer (which is used as the second dielectric layer 322) having a refractive index of 2.44 may be stacked with a repetition of a quarter-wave stack ($\lambda/4 \cdot n \cdot m$). According to the number of stacked layers, high reflectivity of external excitation light (i.e., light from the fluorescent layer) can be obtained and high transmittance of inner generation light (i.e., light from the light emitting device chip) can be obtained but this is not limited by the material and the number of the stacked layers of a dielectric layer used. In this instance, the thickness of the first dielectric layer 321 and the second dielectric layer 322 is $\lambda/(4n \times \cos\theta)$ (where $\lambda$ is a wavelength of light, n is a refractive index of each (or respective) dielectric layer, and $\theta$ is an incidence angle of light). Additionally, m is a number or a thickness thereof.

According to an embodiment, the wavelength filter 320 is formed with a structure where a material of a low refractive index and a material of a high refractive index are stacked, such that light of a short wavelength from the inside of the light emitting device package passes through to the outside without difficulties or without being reflected, as shown in FIG. 2. However, light of a long wavelength converted from the fluorescent layer is re-reflected, such that characteristic preventing or reducing the light from entering into the light emitting device package as is shown in FIG. 3.

Next, the fluorescent layer 330 may be formed on a side opposite to the side of a capping layer 310 where the wavelength filter 320 is formed. The fluorescent layer 330 may have a uniform thickness through conformal coating but is not limited thereto.

The fluorescent layer 330 may add a yellow fluorescent material (such as YAG and TAG) on a blue LED chip, or may use three colors (red/green/blue) fluorescent materials on a UV LED chip but is not limited thereto.

The fluorescent material may include a host material and an active material. Ce active material may be applied to a YAG host material and Eu active material may be applied to a silicate-based host material but is not limited thereto.

Figure 15:
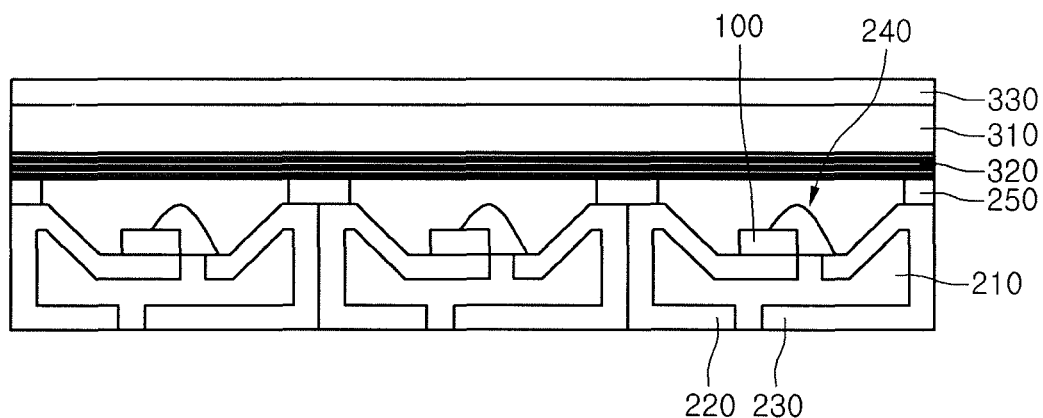

Next, as shown in FIG. 15, the wavelength filter 310 may be contacted on the sub mount 210. In this instance, a space S may be formed between the wavelength filter 320 and the light emitting device chip 100.

In the light emitting device package 200, there is the space S between the selective wavelength filter 320 and the light emitting device chip 100, and the space S may have at least one of air, Ar gas, $N_2$ gas, and vacuum. Accordingly, as shown in FIG. 6, the light L1 of a short wavelength emitted from the light emitting device chip 100 is easily extracted to the outside through a filter, but the light L2 of a long wavelength converted from the light L1 of the short wavelength emitted from the light emitting device chip 100 by the fluorescent material of the fluorescent layer 330. Thus, the selective wavelength filter 320 may effectively increase reflectivity through inner total reflection effect from a high refractive index to a low refractive index.

Since transmittance and reflectivity characteristics of the short and long wavelengths of light for the light emitting device package are discussed with reference FIG. 4 and FIG. 5, respectively, a detailed discussion thereof will be omitted for sake of brevity.

Figure 16:
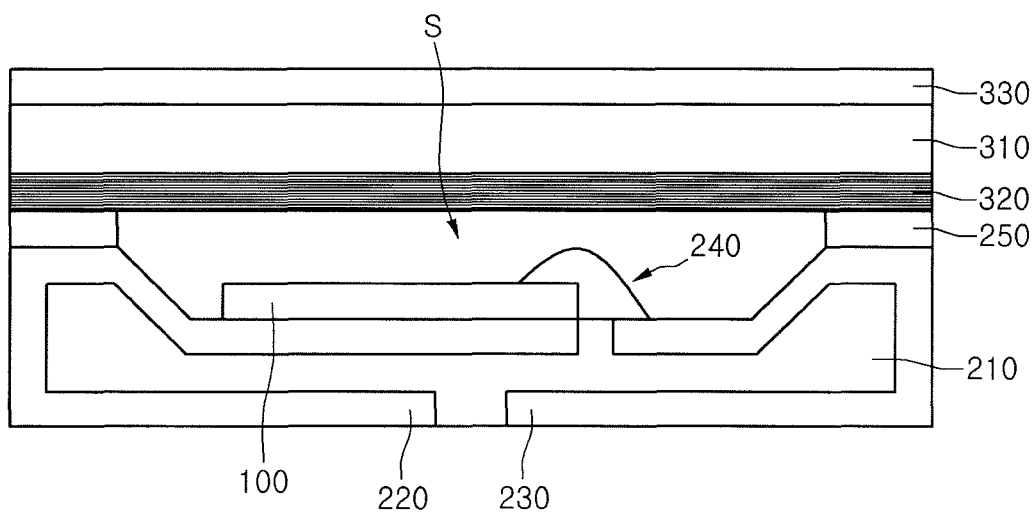

Lastly, as shown in FIG. 16, the light emitting device package may be completed by separating the light emitting device package 200 by each chip 100.

The light emitting device package 200 may be applied to a lighting system. The lighting system may include the lighting unit of FIG. 17, the backlight unit of FIG. 18, traffic lights, vehicle headlights, and signboards, for example.

Figure 17:
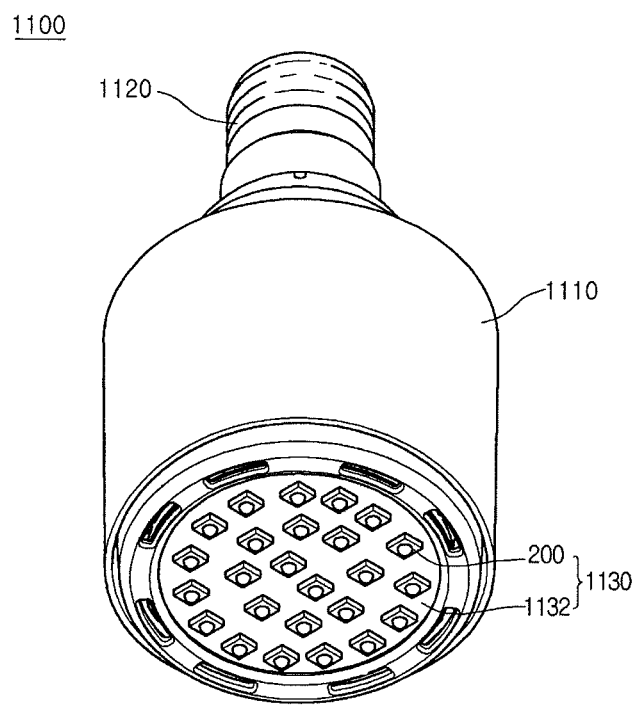
FIG. 17 is a perspective view of a lighting unit according to an embodiment.

FIG. 17 is a perspective view of a lighting unit 1100 using the light emitting device package according to an embodiment. Referring to FIG. 17, the lighting unit 1100 includes a case body 1110, a light emitting module 1130 installed at the case body 1110, and a connection terminal 1120 that is installed at the case body 1110 and receives power from an external power supply.

The case body 1110 may be formed of a material having excellent protection against heat and thus may be formed of a metal material or a resin material.

The light emitting module 1130 may include a substrate 1132 and at least one light emitting device package 200 mounted on the substrate 1132.

The substrate 1132 may be one where a circuit pattern is printed on an insulator and may include a general printed circuit board (PCB), a metal core PCB, a flexible PCB, and a ceramic PCB.

Moreover, the substrate 1132 may be formed of a material that efficiently reflects light or may be formed with a color that reflects light efficiently such as white color and silver color.

The light emitting device package 200 according to at least one of the above embodiments may be mounted on the substrate 1132. Each light emitting device package 200 may include at least one light emitting diode (LED) 100. The LED 100 may include colored LEDs for emitting colors of red, green, blue, or white and an ultraviolet (UV) LED emitting UV light.

The light emitting module 1130 may be arranged to have various kinds of LED combinations to obtain colors and brightness. For example, in order to obtain high color rendering index (CRI), white color LED, red color LED, and green color LED may be combined and disposed.

The connection terminal 1120 is electrically connected to the light emitting module 1130 to provide its power. As shown in FIG. 17, the connection terminal 1120 is spirally combined into the external power supply with a socket type but is not limited thereto. For example, the connection terminal 1120 may be formed with a pin form and be inserted into an external power supply, or may be connected to the external power supply through a wiring.

Figure 18:
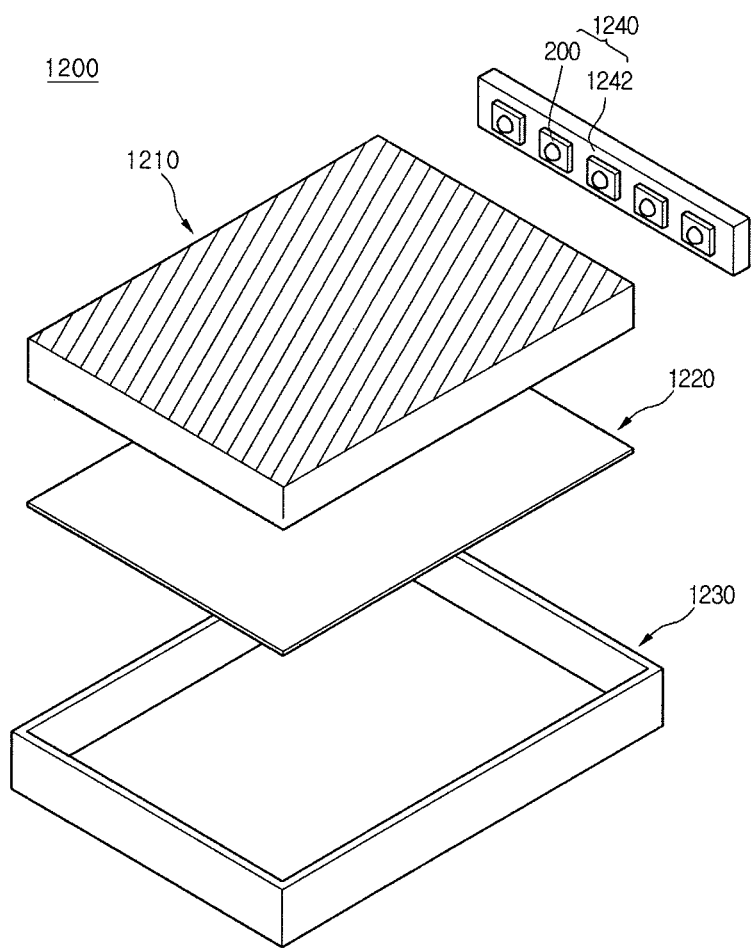
FIG. 18 is an exploded perspective view of a backlight according to an embodiment.

FIG. 18 is an exploded perspective view of a backlight unit according to an embodiment. The backlight unit 1200 includes a light guide plate 1210, a light emitting module unit 1240 for providing light to the light guide plate 1210, a reflective member 1220 below the light guide plate 1210, and a bottom cover 1230 for receiving the light guide plate 1210, the light emitting module unit 1240, and the reflective member 1220, but is not limited thereto.

The light guide panel 1210 may serve to diffuse light to obtain a plane light or planer light. The light guide panel 1210 is formed of a transparent material, and may include at least one of acrylic resins such as polymethyl metaacrylate (PMMA), polyethylene terephthlate (PET), poly carbonate (PC), cycloolefin copolymer (COC), and polyethylene naphthalate (PEN) resins.

The light emitting module unit 1240 provides light to at least one side of the light guide panel 1210 and ultimately serves as a light source of a display device where the backlight unit is installed.

The light emitting module unit 1240 may contact the light guide panel 1210 but is not limited thereto. In more detail, the light emitting module unit 1240 includes a substrate 1242 and a plurality of light emitting device packages 200 mounted on the substrate 1242. The substrate 1242 may contact the light guide plate 1210 but is not limited thereto.

The substrate 1242 may be a printed circuit board (PCB) including a circuit pattern. However, the substrate 1242 may include a metal core PCB and a flexible PCB besides a typical PCB, but is not limited thereto.

Also, in relation to the plurality of light emitting device packages 200, a light emitting plane for emitting light may be mounted on the substrate 1242, being spaced apart from the light guide panel 1210.

The reflective member 1220 may be disposed below the light guide panel 1210. The reflective member 1220 reflects light incident to the bottom of the light guide panel 1210 upwardly such that brightness of the backlight unit can be improved. The reflective member 1220 may be formed of PET, PC, and PVC resins, but is not limited thereto.

The bottom cover 1230 may receive the light guide panel 1210, the light emitting module unit 1240, and the reflective member 1220. For this, the bottom cover 1230 may be formed with the top having an open box form, but is not limited thereto.

The bottom cover 1230 may be formed of metal material or resin material and may be manufactured using processes such as molding or extrusion molding.

The light emitting device package according to embodiments, a selective wavelength filter between the light emitting chip and the fluorescent layer transmit light of a short wavelength having a high energy like a blue visible ray or an ultraviolet ray but reflects light of a long wavelength having a low energy from a fluorescent material, such that effective color rendering index can be obtained.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
a sub mount;
a light emitting device on the sub mount, and configured to generate light of a first wavelength, wherein the light emitting device comprises a light emitting diode;
at least one electrode layer on the sub mount;
a sealing material on the at least one electrode layer;
a dielectric layer on the sealing material;
a glass capping layer disposed on the dielectric layer; and
a fluorescent layer on the glass capping layer, and configured to convert the light of the first wavelength into light of a second wavelength,
wherein the dielectric layer includes a plurality of layers having at least two different refractive indices, that transmits the light of the first wavelength and reflects the light of the second wavelength,
wherein the glass capping layer is disposed between the dielectric layer and the fluorescent layer, and
wherein the sealing material comprises a glass material or an epoxy material.

2. The light emitting device package according to claim 1, wherein a space is formed between the dielectric layer and the light emitting device.

3. The light emitting device package according to claim 2, wherein the space is filled with a material having a refractive index lower than the dielectric layer.

4. The light emitting device package according to claim 2, wherein the space includes at least one of Ar gas, $N_2$ gas, and a vacuum.

5. The light emitting device package according to claim 1, wherein the dielectric layer transmits the light of the first wavelength from the light emitting device and reflects the light of the second wavelength from the fluorescent layer.

6. The light emitting device package according to claim 1, wherein the first wavelength is about 440 nm to 460 nm and the second wavelength is about 560 nm to 580 nm.

7. The light emitting device package according to claim 1, wherein the fluorescent layer has a uniform thickness.

8. The light emitting device package according to claim 1, wherein the plurality of layers comprises:
a first dielectric layer having a first refractive index; and
a second dielectric layer having a second refractive index different from the first refractive index.

9. The light emitting device package according to claim 8, wherein:
the first dielectric layer comprises a $SiO_2$ layer; and
the second dielectric layer comprises a $TiO_2$ layer.

10. The light emitting device package according to claim 8, wherein a thickness of the first dielectric layer and the second dielectric layer is respectively $\lambda/(4n \times \cos\theta)$ (where $\lambda$ is a wavelength of light, n is a refractive index of each dielectric layer, and $\theta$ is an incidence angle of light).

11. The light emitting device package according to claim 1, wherein the dielectric layer has a top surface of a uniform plane.

12. A lighting system comprising a light emitting module unit equipped with the light emitting device package of claim 1.

13. The light emitting device package according to claim 2, wherein the space includes a vacuum.

14. The light emitting device package according to claim 1, wherein a space is formed between the dielectric layer and the light emitting device, and
wherein the space between the dielectric filter and the light emitting device is fully filled with an air gap.

15. The light emitting device package according to claim 1, wherein a side surface of the sealing material is aligned with a side surface of the at least one electrode layer.

16. A light emitting device package, comprising:
a sub mount;
a light emitting device on the sub mount, and configured to generate light of a first wavelength, wherein the light emitting device comprises a light emitting diode;
at least one electrode layer, wherein the light emitting device is disposed on the at least one electrode layer and the at least one electrode layer comprises a reflecting layer;
a filter disposed on an uppermost surface of the sub mount;
a sealing material disposed between the filter and the at least one electrode layer;
a capping layer on the filter; and
a fluorescent layer on the capping layer, and configured to convert the light of the first wavelength into light of a second wavelength,
wherein the filter includes a plurality of layers having at least two different refractive indices, that transmits the light of the first wavelength and reflects the light of the second wavelength,
wherein the capping layer is disposed between the filter and the fluorescent layer,
wherein a bottom surface of the filter is higher than an uppermost surface of the reflecting layer,
wherein a space is formed between the filter and the light emitting device, and
wherein the space between the filter and the light emitting device is fully filled with an air gap, and
wherein the sealing material comprises a glass material or an epoxy material.

17. The light emitting device package according to claim 16, wherein the filter includes a plurality of dielectric layers.

18. The light emitting device package according to claim 16, wherein a side surface of the sealing material is aligned with side surfaces of the filter and the capping layer.

* * * * *